(12) United States Patent
Lin

(10) Patent No.: US 9,632,548 B1
(45) Date of Patent: Apr. 25, 2017

(54) STRUCTURE OF POWER INPUT END AND POWER OUTPUT END OF POWER SUPPLY DEVICE

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 15/199,893

(22) Filed: Jun. 30, 2016

(51) Int. Cl.
*G06F 1/20* (2006.01)
*H05K 7/20* (2006.01)
*G06F 1/18* (2006.01)

(52) U.S. Cl.
CPC ............... *G06F 1/20* (2013.01); *G06F 1/189* (2013.01); *H05K 7/20554* (2013.01)

(58) Field of Classification Search
CPC .... G06F 1/00; G06F 1/189; G06F 1/20; H02J 1/00
USPC .......................................... 361/678; 219/660
See application file for complete search history.

(56) References Cited

U.S. PATENT DOCUMENTS

| | | | |
|---|---|---|---|
| 9,538,679 B1* | 1/2017 | Lin | H05K 7/1432 |
| 2001/0051450 A1* | 12/2001 | Ross | H01R 4/34 439/78 |
| 2003/0043548 A1* | 3/2003 | Cheng | G06F 1/18 361/720 |
| 2012/0234831 A1* | 9/2012 | Lin | H05K 7/1487 220/23.4 |

* cited by examiner

*Primary Examiner* — Dion R Ferguson
*Assistant Examiner* — Mandeep S Buttar
(74) *Attorney, Agent, or Firm* — Ming Chow; Sinorica, LLC

(57) ABSTRACT

An improved structure of a power input end and a power output end of a power supply device is provided. The power supply includes a casing and a main body. A rear side of the casing is provided with a back plate having first heat dissipation holes. One side of an inner wall of the casing is provided with a power input end and a protection cover. A rear side of the protection cover is provided with an upright plate having a threaded hole and second heat dissipation holes parallel to the first heat dissipation holes. The interior of the casing is provided with two power output ends each in the form of a plate perpendicular to the back plate. The present invention lowers the sheltered area of the back plate to form a better heat dissipation structure. The protection cover can be disassembled easily.

7 Claims, 6 Drawing Sheets

STRUCTURE OF POWER INPUT END AND POWER OUTPUT END OF POWER SUPPLY DEVICE

BACKGROUND OF THE INVENTION

1. Field of the Invention

The present invention relates to a structure of a power input end and a power output end of a power supply device, and more particularly to an improved structure of a power input end and a power output end of a power supply device.

2. Description of the Prior Art

With the development of technology, the efficacy of computers is improved increasingly. The power consumption is also increasing, which results in a large amount of waste heat. Because the structures of various computer equipment and instruments are gradually sophisticated, it is strict for the quality of a power supply accordingly. In general, the waste heat generated by the computer is accumulated in the power supply, which causes the temperature of the power supply is gradually increased. If the heat does not be exhausted, it may affect the efficiency of the internal components of the power supply and shorten the service life of the power supply.

In a conventional structure of a power input end and a power output end of a power supply, the power supply comprises a casing. A rear side of the casing is longitudinally provided with a back plate. The back plate is a flat plate. The casing is provided with a power supply main body therein. The main body is electrically connected with an input end and an output end. The back plate has an opening. The opening of the back plate is provided with a plate member. The plate member has holes corresponding to the input end and the output end of the main body and the other connecting ends respectively for engagement. The back plate is formed with a plurality of ventilation holes for exhausting the waste heat of the power supply out of the casing. However, the size of the plate member of the back plate is directly proportional to the number of the connecting ends of the power supply, and the size of the plate member is inversely proportional to the number of the ventilation holes of the back plate. This design blocks the guide of heat dissipation.

Accordingly, the inventor of the present invention has devoted himself based on his many years of practical experiences to solve these problems.

SUMMARY OF THE INVENTION

The primary object of the present invention is to provide an improved structure of a power input end and a power output end of a power supply device to lower the sheltered area of the heat dissipation structure so as to improve the dissipation efficiency effectively.

In order to achieve the aforesaid object, an improved structure of a power input end and a power output end of a power supply device is provided. The power supply comprises a casing and a main body. A rear side of the casing is longitudinally provided with a back plate. The main body is disposed in the casing. The back plate has a plurality of first heat dissipation holes. The back plate further has an input hole and an output hole close to the first heat dissipation holes. At least one power input unit is provided. The power input unit comprises a protection cover, at least one L-shaped plate, and a power input end. One end of the L-shaped plate and the power input end are jointly disposed at one side of an inner wall of the casing. The power input end extends out of the input hole of the back plate. The power input end is electrically connected with the main body. The protection cover is provided with an upright plate parallel to the back plate. The upright plate has at least one threaded hole for another end of the L-shaped plate to be screwed therein. The protection cover is adapted to cover the power input end. The upright plate of the protection cover has a plurality of second heat dissipation holes parallel to the first heat dissipation holes. At least one power output unit is provided. The power output unit comprises at least one power output end. The power output end is in the form of a plate and disposed in the casing. The power output end is electrically connected with the main body. The power output end is perpendicular to the back plate and extends out of the output hole of the back plate.

Through the power output end perpendicular to the first heat dissipation holes of the back plate and the second dissipation holes of the protection cover, the present invention lowers the sheltered area of the heat dissipation structure. The protection cover can be disassembled easily, which is convenient for assembly and disassembly of the power wire.

DETAILED DESCRIPTION OF THE PREFERRED EMBODIMENTS

Embodiments of the present invention will now be described, by way of example only, with reference to the accompanying drawings.

Figure 1:
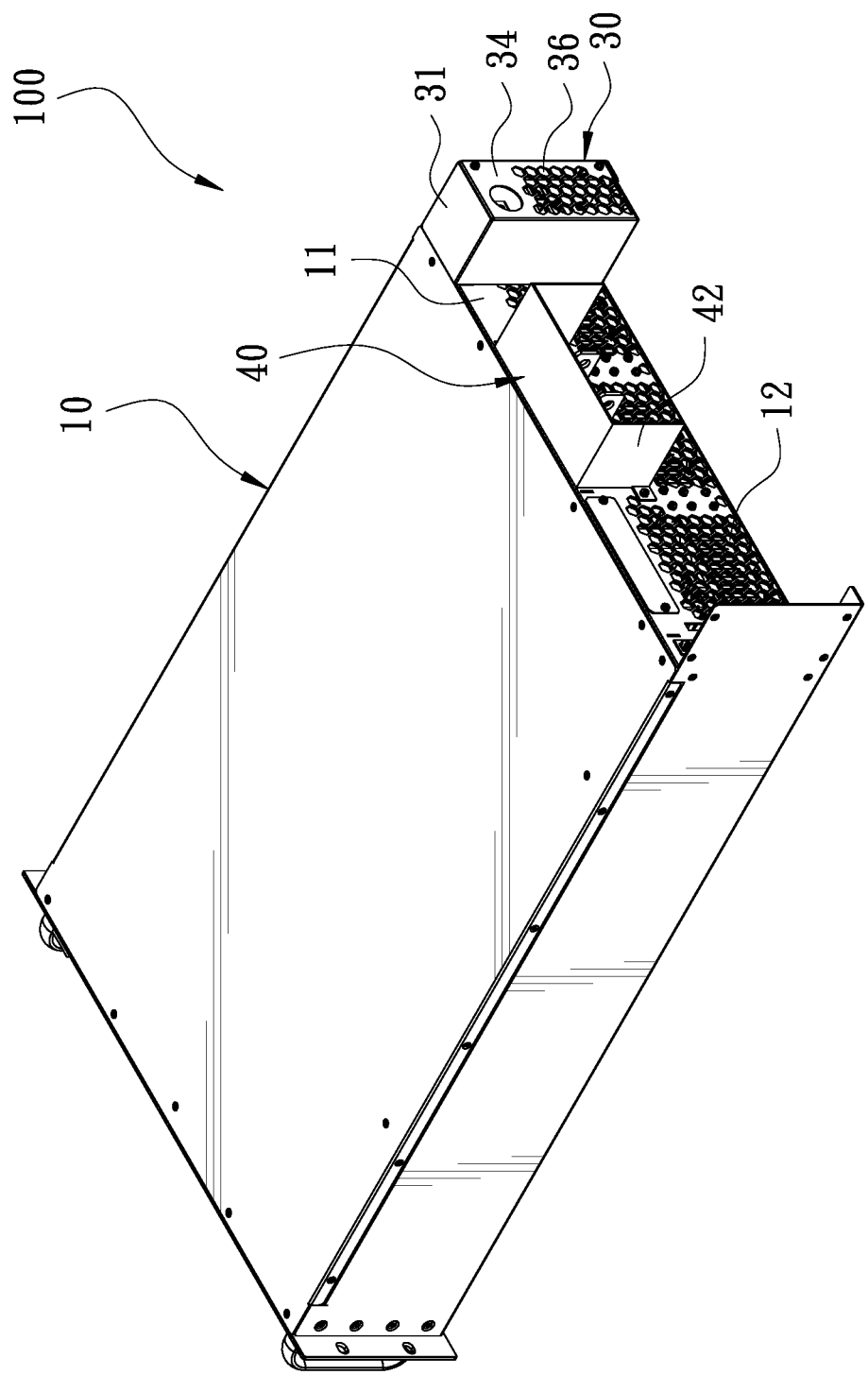
FIG. 1 is a perspective view in accordance with a preferred embodiment of the present invention.
Figure 2:
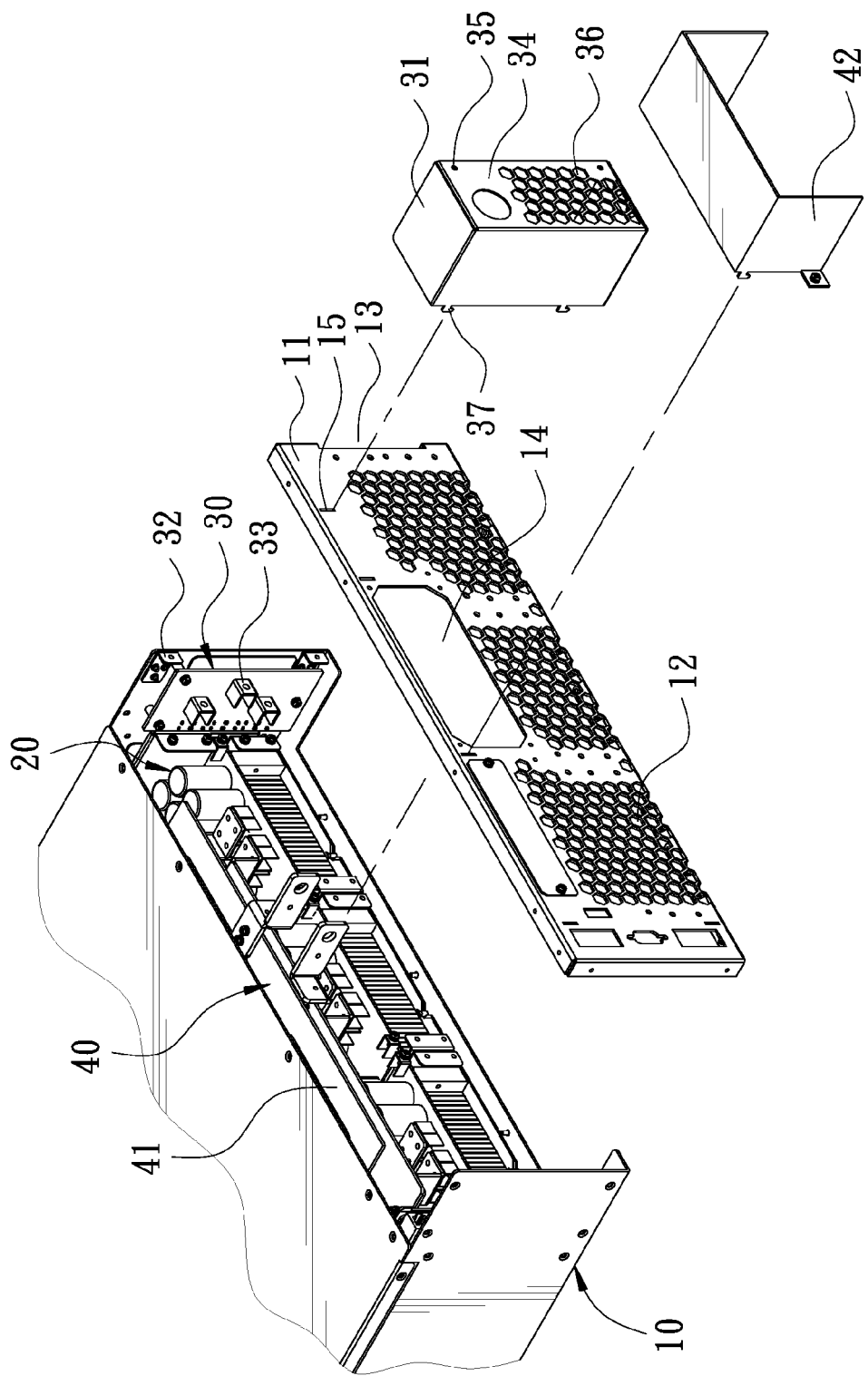
FIG. 2 is an exploded view in accordance with the preferred embodiment of the present invention.

FIG. 1 is a perspective view of the present invention. FIG. 2 is an exploded view of the present invention. The present invention discloses an improved structure of a power input end and a power output end of a power supply device 100. In the embodiment of the present invention, the power supply 100 comprises a casing 10, a main body 20, a power input unit 30, and two power output units 40.

A rear side of the casing 10 is longitudinally provided with a back plate 11. The back plate 11 has a plurality of first heat dissipation holes 12. The first heat dissipation holes 12 are arranged in the form of a honeycomb. The back plate 11 has an input hole 13 and an output hole 14 close to the first heat dissipation holes 12. The back plate 11 is further provided with an engaging groove 15.

The main body 20 is disposed in the casing 10. The main body 20 has a plurality of fans for guiding the waste heat generated by the main body 20 to the back plate 11.

The power input unit 30 comprises a protection cover 31, two L-shaped plates 32, and a power input end 33. One end of each L-shaped plate 32 and the power input end 33 are jointly disposed at one side of an inner wall of the casing 10. The power input end 33 extends out of the input hole 13 of the back plate 11. The power input end 33 is electrically connected with the main body 20. The protection cover 31 is provided with an upright plate 34 parallel to the back plate 11. The upright plate 34 has two threaded holes 35 for another end of each L-shaped plate 32 to be screwed therein. The protection cover 31 is adapted to cover the power input end 33. The upright plate 34 of the protection cover 31 has a plurality of second heat dissipation holes 36 parallel to the first heat dissipation holes 12. The second heat dissipation holes 36 are arranged in the form of a honeycomb. A front side of the protection cover 31 is provided with an engaging hook 37 corresponding to the engaging groove 15. The engaging hook 37 is engaged in the engaging groove 15.

Each power output unit 40 comprises at least one power output end 41. The power output end 41 is in the form of a plate. The power output end 41 is horizontally disposed in the casing 10. The power output end 41 is electrically connected with the main body 20. The power output end 41 is perpendicular to the back plate 11 and extends out of the output hole 14 of the back plate 11. The power output end 41 further comprises a protection member 42 disposed on the back plate 11 and surrounding the output hole 14. The protection member 42 is perpendicular to the back plate 11, such that the power output end 41 is located at the inner side of the protection member 42 to be protected.

Figure 3:
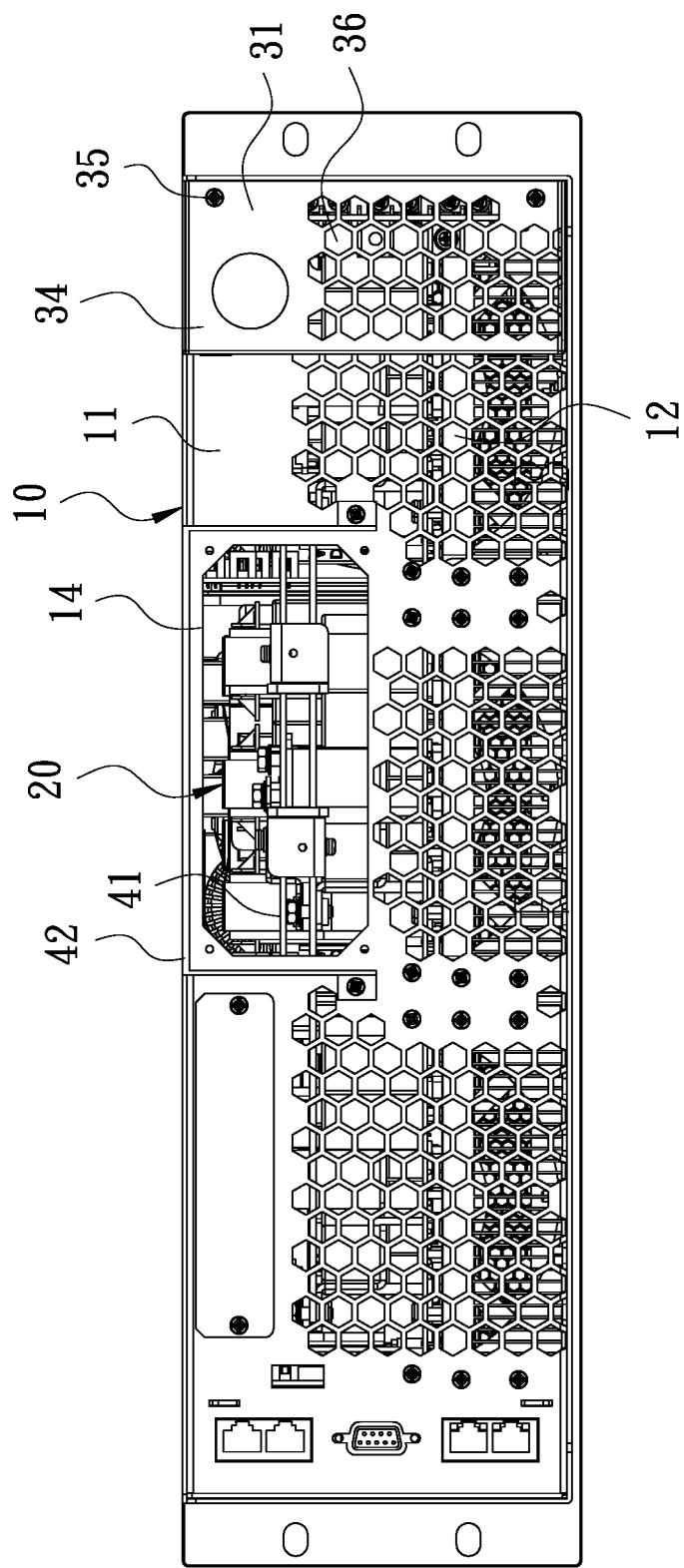
FIG. 3 is a rear view in accordance with the preferred embodiment of the present invention, showing the arrangement of the power input end, the power output end, the back plate, the protection cover, and the protection member.

FIG. 3 is a rear view in accordance with the preferred embodiment of the present invention. When the power supply 100 is actuated, the fans 20 are simultaneously running to blow the waste heat generated by the main body 20 in the direction of the back plate 11 of the casing 10. The waste heat passes through the power output end 41 and then is guided to the back plate 11. Finally, the waste heat is exhausted out of the casing 10 through the input hole 13, the output hole 14, and the first heat dissipation hole 12 of the back plate 11. A portion of the waste heat enters the protection cover 31 after exhausted out of the back plate 11 and passes through the power output end 41 to be exhausted through the second heat dissipation holes 36. The present invention has a smooth heat dissipation structure to enhance the heat dissipation efficiency so as to prolong the service life of the power supply 100.

Figure 4:
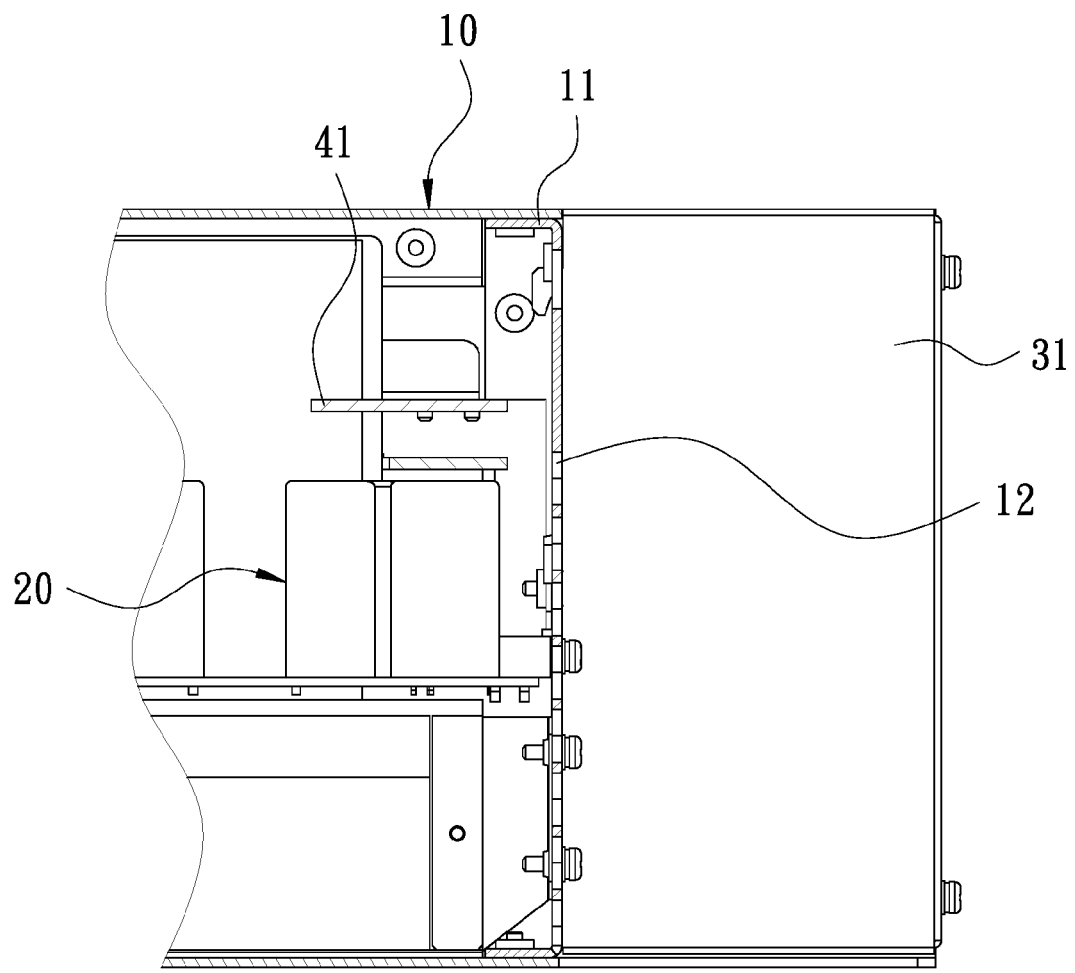
FIG. 4 is a side sectional view in accordance with the preferred embodiment of the present invention, showing the configuration of the first heat dissipation holes and the power output end.

FIG. 4 is a side sectional view in accordance with the preferred embodiment of the present invention, showing the configuration of the first heat dissipation holes 12 and the power output end 41. Because the back plate 11 is longitudinally disposed at the rear side of the casing 10, the direction of the first heat dissipation holes 12, the input hole 13 and the output hole 14 of the back plate 11 is the same as that of the back plate 11. The power output end 41 is in the form of a plate and horizontally disposed in the casing 10. The power output end 41 is designed in a thin configuration. The protection member 42 is perpendicular to the back plate 11 and the first heat dissipation holes 12, so that the sheltered area in the heat dissipation direction of the waste heat of the main body 20 is minimal. The invention is novel and can lower the sheltered area of the back plate effectively to form a better heat dissipation structure.

Figure 5:
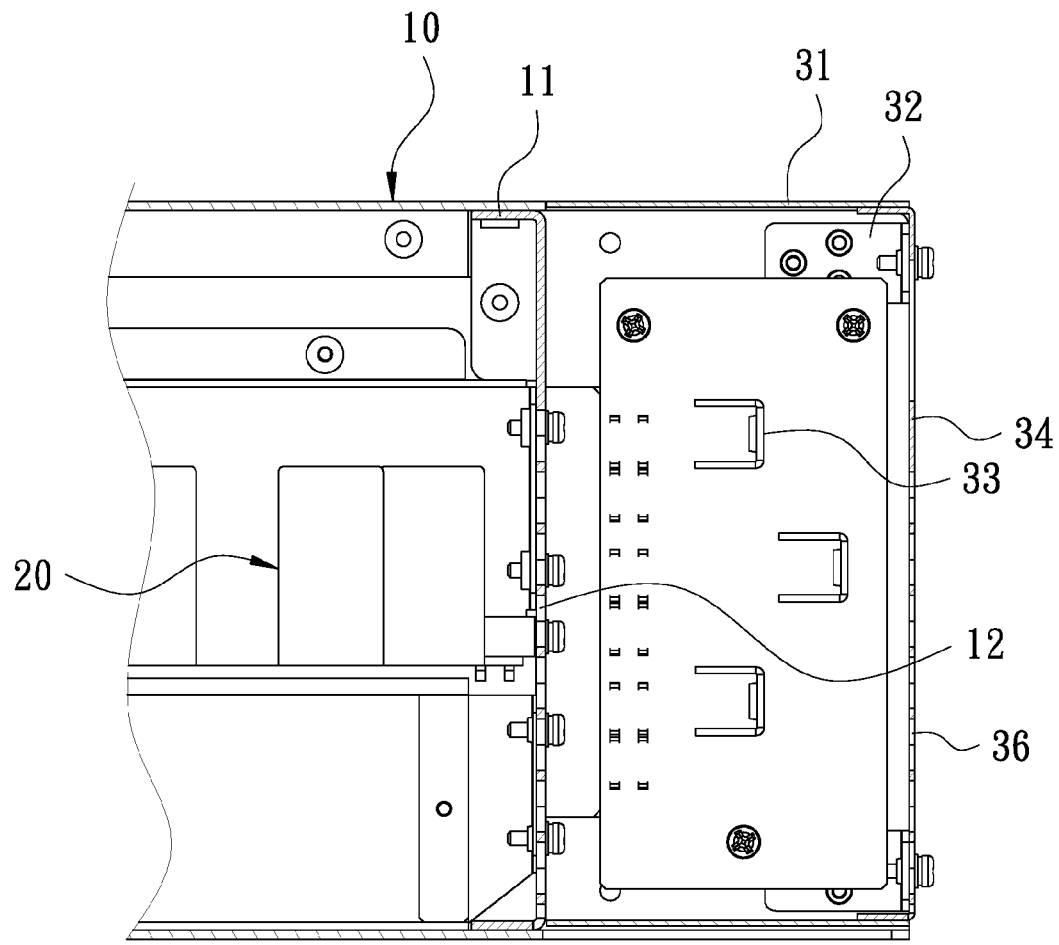
FIG. 5 is a side sectional view in accordance with the preferred embodiment of the present invention, showing the configuration of the first heat dissipation holes, the second heat dissipation holes and the power input end.

FIG. 5 is a side sectional view in accordance with the preferred embodiment of the present invention, showing the configuration of the first heat dissipation holes 12, the second heat dissipation holes 36 and the power input end 33. The power input end 33 is disposed at one side of the inner wall of the casing 10. The second heat dissipation holes 36 of the upright plate 34 are parallel to the first heat dissipation holes 12 of the back plate 11, so that the waste heat can be guided smoothly to improve the heat dissipation effect. The threaded holes 35 of the protection cover 31 are disposed on the upright plate 34, enabling the protection cover 31 to be detached with ease. Thus, A power wire can be assembled and disassembled conveniently.

Figure 6:
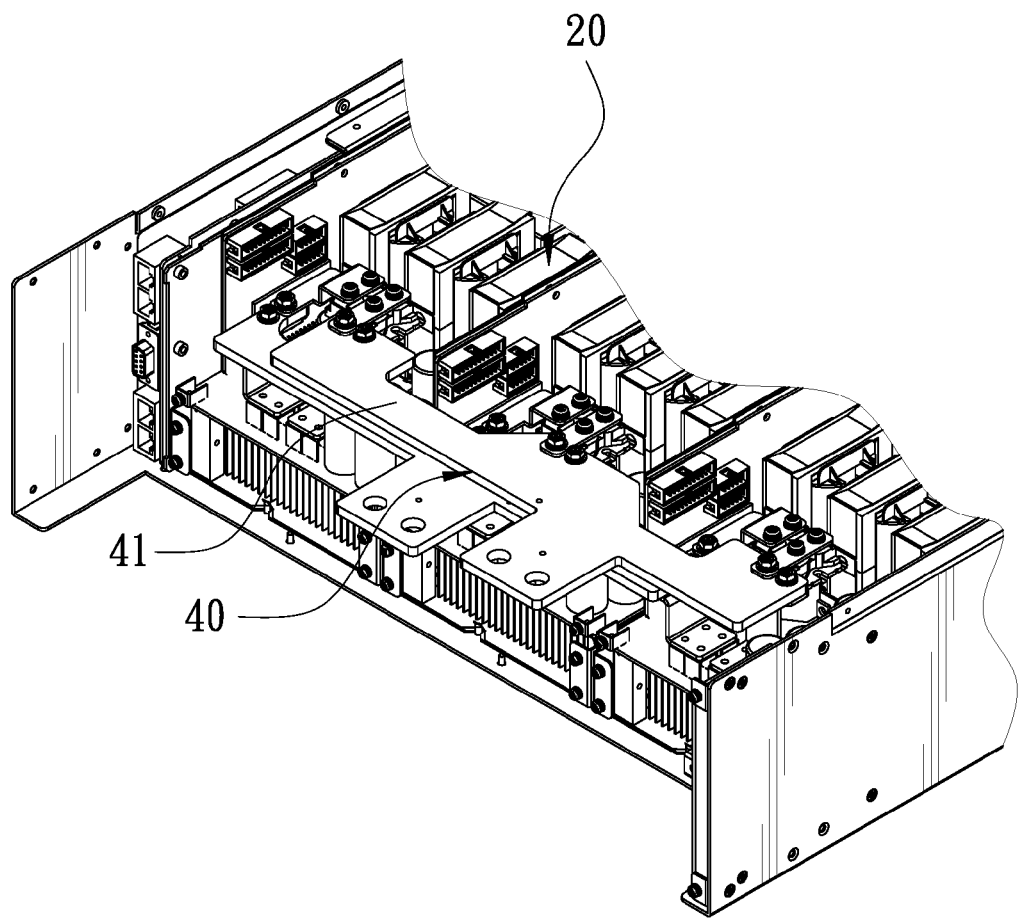
FIG. 6 is a schematic view of another embodiment of the present invention, showing another embodiment of the power output end.

FIG. 6 is a schematic view of another embodiment of the present invention, showing another embodiment of the power output end. The power output end 41 is an integral and flat plate for the output of high current, such that the sheltered area in the heat dissipation direction is minimal to provide a better heat dissipation effect.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. An improved structure of a power input end and a power output end of a power supply device, the power supply comprising a casing and a main body, a rear side of the casing being longitudinally provided with a back plate, the main body being disposed in the casing, characterized by:

the back plate having a plurality of first heat dissipation holes, the back plate further having an input hole and an output hole close to the first heat dissipation holes;

at least one power input unit, the power input unit comprising a protection cover, at least one L-shaped plate, and a power input end, one end of the L-shaped plate and the power input end being jointly disposed at one side of an inner wall of the casing, the power input end extending out of the input hole of the back plate, the power input end being electrically connected with the main body, the protection cover being provided with an upright plate parallel to the back plate, the upright plate having at least one threaded hole for another end of the L-shaped plate to be screwed therein, the protection cover being adapted to cover the power input end;

at least one power output unit, the power output unit comprising at least one power output end, the power output end being in the form of a plate and disposed in the casing, the power output end being electrically connected with the main body, the power output end being perpendicular to the back plate and extending out of the output hole of the back plate.

2. The improved structure of a power input end and a power output end of a power supply device as claimed in claim 1, wherein the first heat dissipation holes are arranged in the form of a honeycomb.

3. The improved structure of a power input end and a power output end of a power supply device as claimed in claim 1, wherein the power output end is disposed horizontally.

4. The improved structure of a power input end and a power output end of a power supply device as claimed in claim 1, wherein the power output end further comprises a protection member disposed on the back plate and surrounding the output hole, the protection member is perpendicular to the back plate, and the power output end is located at an inner side of the protection member to be protected.

5. The improved structure of a power input end and a power output end of a power supply device as claimed in claim 1, wherein the upright plate of the protection cover has a plurality of second heat dissipation holes parallel to the first heat dissipation holes.

6. The improved structure of a power input end and a power output end of a power supply device as claimed in claim 5, wherein the second heat dissipation holes are arranged in the form of a honeycomb.

7. The improved structure of a power input end and a power output end of a power supply device as claimed in claim 1, wherein the back plate further has an engaging groove, and a front side of the protection cover is provided with an engaging hook corresponding to the engaging groove.

* * * * *